US006969645B2

(12) United States Patent
Schmitz et al.

(10) Patent No.: US 6,969,645 B2
(45) Date of Patent: Nov. 29, 2005

(54) METHOD OF MANUFACTURING A SEMICONDUCTOR DEVICE COMPRISING A NON-VOLATILE MEMORY WITH MEMORY CELLS

(75) Inventors: Jurriaan Schmitz, Eindhoven (NL); Franciscus Petrus Widdershoven, Leuven (BE); Michiel Slotboom, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/482,185

(22) PCT Filed: Jul. 3, 2002

(86) PCT No.: PCT/IB02/02580

§ 371 (c)(1), (2), (4) Date: Dec. 22, 2003

(87) PCT Pub. No.: WO03/005440

PCT Pub. Date: Jan. 16, 2003

(65) Prior Publication Data

US 2004/0175885 A1 Sep. 9, 2004

(30) Foreign Application Priority Data

Jul. 3, 2001 (EP) ................................. 01202552
Jul. 18, 2001 (EP) ................................. 01202729

(51) Int. Cl.[7] .......................................... H01L 21/8238
(52) U.S. Cl. ...................... 438/201; 438/199; 438/211; 438/257; 438/263
(58) Field of Search ................ 438/201, 211, 257–267, 438/197, 199; 257/314–317

(56) References Cited

U.S. PATENT DOCUMENTS 6,232,185 B1 * 5/2001 Wang ......................... 438/266

* cited by examiner

*Primary Examiner*—Carl Whitehead, Jr.
*Assistant Examiner*—Thanhha Pham
(74) *Attorney, Agent, or Firm*—Peter Zawilski

(57) ABSTRACT

A method of manufacturing a semiconductor device comprising a non-volatile memory with memory cells (Mij) including a select transistor (T1) with a select gate (1) and including a memory transistor (T2) with a floating gate (2) and a control gate (3). In a semiconductor body (10), active semiconductor regions are formed which are mutually insulated by field oxide regions (12). Next, the surface (11) is provided with a gate oxide layer (14) and a first layer of a conductive material wherein the select gate (1) is etched. Subsequently, the walls of the select gate extending perpendicularly to the surface are provided with an isolating material (17). The gate oxide next to the select gate is replaced by a layer of tunnel oxide (18). Next, a second layer of a conductive material (21), an interlayer dielectric (25) and a third layer of a conductive material (26) are deposited. The control gate (3) extending above and next to the select gate is formed in the third layer. Using the control gate as a mask, the floating gate (2) is subsequently etched in the second layer of conductive material. In this method, the second layer is deposited in a larger thickness than the select gate, after which this layer is planarized prior to the deposition of the interlayer dielectric and the third layer of conductive material. In this manner, a compact memory cell can be manufactured.

8 Claims, 6 Drawing Sheets

Figure 1:
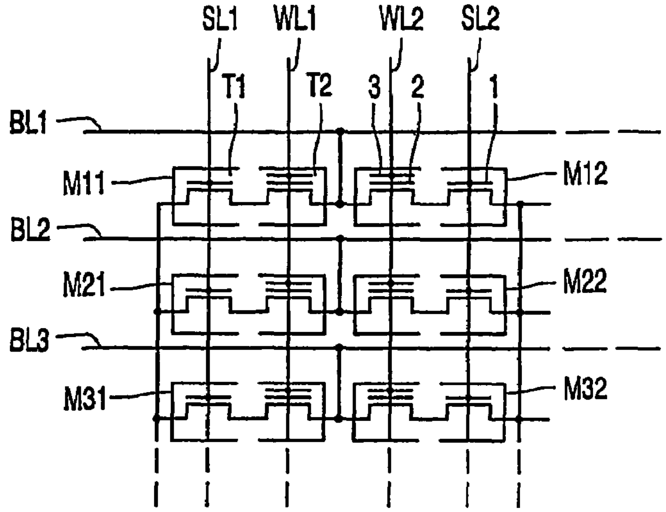

METHOD OF MANUFACTURING A SEMICONDUCTOR DEVICE COMPRISING A NON-VOLATILE MEMORY WITH MEMORY CELLS

The invention relates to a method of manufacturing a semiconductor device comprising a non-volatile memory with memory cells including a select transistor with a select gate and including a memory transistor with a floating gate and a control gate, in which method active semiconductor regions are formed in a semiconductor body, which active semiconductor regions border on a surface of said semiconductor body and are mutually insulated by field oxide, after which the surface is provided with a layer of gate oxide and a first layer of a conductive material, wherein the select gate is etched, after which the select gate is provided, on its side walls extending transversely to the surface, with an insulating material, and the gate oxide next to the select gate is removed and substituted with a layer of a tunnel oxide, whereafter a second layer of a conductive material, a layer of an intermediate dielectric and a third layer of a conductive material are deposited, in which third layer of conductive material the control gate is formed which extends above and next to the select gate, whereafter the floating gate is etched in the second layer of conductive material, using the control gate as a mask.

Such a method is disclosed in U.S. Pat. No. 5,550,073, wherein, after the formation of the select gate and the insulation on the side walls thereof, a packet of layers comprising the second layer of conductive material, the layer of an intermediate dielectric and the third layer of conductive material are successively deposited. The control gate is etched in the third layer and, using the control gate as a mask, the layer of an intermediate dielectric and the second layer of conductive material are etched in accordance with a pattern, thereby forming the floating gate that is situated right next to the select gate.

When the layer packet comprising the second layer of conductive material, the layer of an intermediate dielectric and the third layer of conductive material are deposited, said layers follow the contours of the select gate formed. Above the select gate, and at a comparatively large distance from said select gate, the layers extend substantially parallel to the surface of the semiconductor body, whereas, next to the select gate, the layers extend substantially perpendicularly to the surface of the semiconductor body. After the layer packet has been deposited, its surface exhibits comparatively large differences in height; the surface exhibits a comparatively pronounced topography. In addition, at the location where the layers in the layer packet extend transversely to the surface of the semiconductor body, said layers exhibit, viewed in the direction transverse to the surface, a large thickness. Due to said pronounced topography and the differences in thickness, it is difficult to form a control gate and a floating gate of small dimensions in the layer packet. These gates are preferably formed such that they have a side wall that extends transversely to the surface of the semiconductor body and is situated next to the region where the layers in the layer packet are comparatively thick. As a result, this side wall is situated at a comparatively large distance from the select gate.

It is an object of the invention to obviate said drawbacks. To achieve this, the method is characterized in that the second layer of conductive material is deposited in a thickness that exceeds the thickness of the select gate, whereafter this layer of conductive material is planarized before the layer of an intermediate dielectric and the third layer of conductive material are deposited. The layer of the intermediate dielectric and the third layer of conductive material are then deposited on a flat surface and hence also exhibit a flat surface and, in addition, a homogeneous thickness. By virtue thereof, the control gate and the floating gate can be formed more readily. In addition, these gates can be formed such that a wall thereof extends transversely to the surface of the semiconductor body and at a comparatively small distance from the select gate.

It is to be noted that DE 196 43 185 C2 discloses a method of manufacturing a memory cell comprising a select transistor with a select gate and a memory transistor with a floating gate and a control gate, in which method the select gate and the floating gate are formed so as to be juxtaposed in a first layer of a conductive material. In said method, the select gate and the floating gate are mutually insulated by a groove that is etched in the first layer of conductive material. This flat structure is provided with a layer of an intermediate dielectric, which also fills said groove, and a second layer of a conductive material. A control gate that overlaps the groove is etched in the second layer of conductive material. Subsequently, the select gate and the floating gate are etched in the first layer of conductive material, using said control gate as a mask.

In this method, prior to the deposition of the first layer of conductive material, a gate oxide layer and a tunnel oxide layer are formed on the surface so as to be juxtaposed, and the groove in the first layer of conductive material is formed near the transition between tunnel oxide and gate oxide. In practice, it is impossible to form this groove exactly at the transition from the tunnel oxide to the gate oxide. Thus, the width of the groove must be such that aligning tolerances can be dealt with during the formation of the mask. In the method in accordance with the invention, the tunnel oxide is not formed until after the select gate has been formed and is directly adjacent to the layer of insulating material formed on the side wall of the select gate. In this case, the tunnel oxide/gate oxide transition is situated exactly in the layer of insulating material on the side wall of the select gate.

In practice, the memory cells of a memory are arranged in rows and columns. In this case, for example, the select gates of the select transistors of a column of memory cells are interconnected. This can be achieved by means of an additional wiring layer consisting of a layer of an insulating material on which conductor tracks are provided which are connected to the select gates in contact windows. A simpler way of achieving this consists in that, in the first layer of conductive material, conductive strips serving as select lines are formed so as to extend transversely to the active regions, which conductive strips are provided on the walls extending transversely to the surface with a layer of an insulating material, and which form, at the location of the active regions, the memory transistors' select gates provided with insulating material on the side walls.

In practice, also, for example, the control gates of the memory transistors of a column of memory cells are interconnected by means of word lines. For this purpose use can be made of an additional wiring layer, however, this can also be achieved in a simpler way. For this purpose, after the planarization of the second layer of conductive material, grooves are etched in this layer, which extend transversely to the conductor tracks serving as select lines, the insulating layers formed on the select lines and the surface next to the select lines being exposed in said grooves. During deposition of the layer of an intermediate dielectric and the third layer of conductive material, these grooves are filled. When the comparatively thin layer of the intermediate dielectric is deposited, it follows the contours of the grooves; the comparatively thick layer of conductive material entirely fills the grooves and, after the deposition process, exhibits a substantially flat surface at the location of the grooves. Subsequently, conductive strips, serving as word lines, are formed in the third layer of conductive material and extend parallel to the select lines and at least partly overlap the select lines, which conductive strips form the control gates of the memory transistors at the location of the floating gates. During etching the floating gates, the control gates, i.e. in this case the conductor tracks serving as word lines, are used as a mask. The length of the floating gates, in the direction of the select gates and the control gates, is now determined by the distance between the slits etched in the second layer of conductive material.

Preferably, before forming the select lines in the first layer of conductive material, a layer of an insulating material is deposited on this layer, and the select lines are formed in the first layer of conductive material and in the layer of insulating material deposited thereon. The select lines and hence the select gates are thus readily provided, on the upper side, with an insulating layer.

Preferably, an insulating layer is deposited that is made of a material that can be used as a stop layer when the second layer of conductive material is being planarized. In practice, for the material of the first, second and third layer of conductive material use is made of a layer of silicon, an alloy of silicon and germanium or an alloy of silicon and carbon, which layer is deposited in the form of a polycrystalline or amorphous layer. In this case, preferably a layer of silicon nitride is used as the stop layer.

The planarization of the second layer of conductive material can be terminated in a controlled manner if the planarization operation is continued until the layer of insulating material present on the select gate is exposed. This can be readily detected in practice. If a stop layer is used, the planarization operation even stops at this layer.

A very compact memory cell is obtained if the control gate is formed such that it overlaps the select gate only partly and that, when the second layer of conductive material is subjected to an etching process wherein the control gate is used as a mask, also the exposed part of the select gate is etched away.

If the planarization of the second layer of conductive material is interrupted before this layer of conductive material has been completely removed above the select gate, then the second layer of conductive material will extend over the select gate after the planarization process. As a result, throughout its width, the control gate will be situated on the floating gate. In this manner, a substantial capacitive coupling between control gate and floating gate is obtained. As a result, data can be stored in the memory at a comparatively low voltage on the control gate, and stored data can be read at a comparatively high voltage on the control gate.

If the planarization of the second layer of conductive material is interrupted before this layer has been completely removed above the select gate, a very compact memory cell can be obtained if the second layer of conductive material is locally removed, before the layer of the intermediate dielectric is deposited, so that this second layer of conductive material overlaps the select gate only partly, and the control gate is formed such that it does not completely overlap the select gate, whereas it does completely overlap the second layer of conductive material, and, in the etching process of the second layer of conductive material, wherein the control gate is used as a mask, also the part of the select gate that is not covered by the control gate is etched away. As the second layer of conductive material is locally removed from the select gate, only a layer of an intermediate dielectric is situated at the edge of the control gate between the third layer of conductive material and the select gate. In practice, this enables the select gate to be etched. If the floating gate were situated on the edge of the control gate, then etching of the select gate would seriously affect the edge of the floating gate situated below the intermediate dielectric since, in practice, they are both formed in the same conductive material.

These and other aspects of the invention will be apparent from and elucidated with reference to the embodiment(s) described hereinafter.

Figure 14:
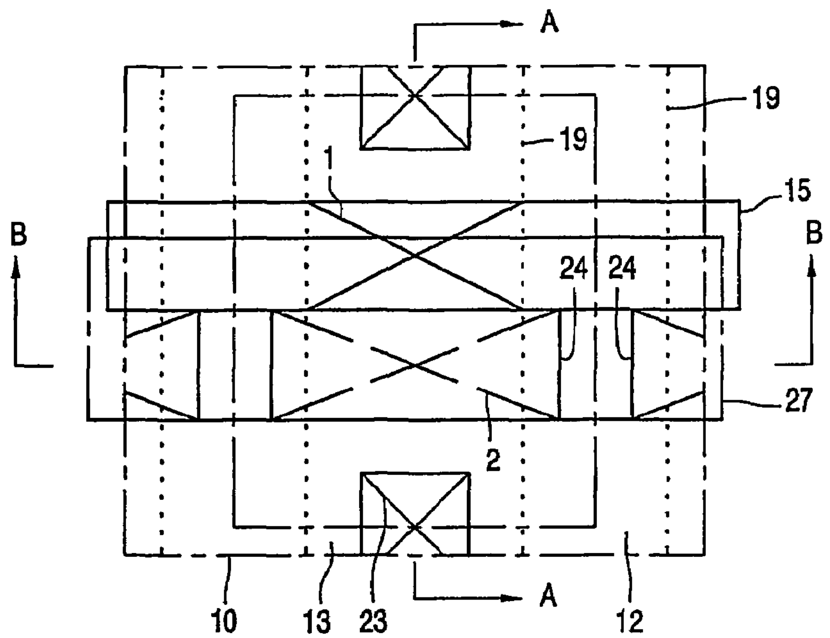
Figure 15:
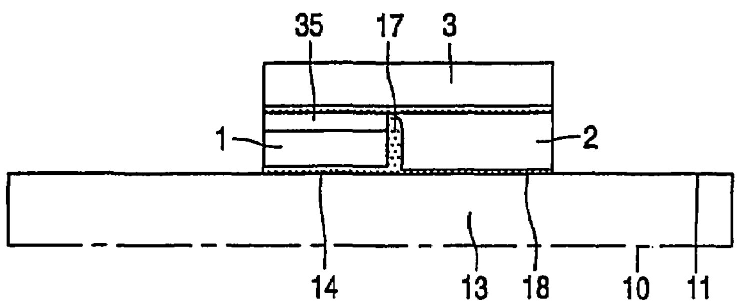
Figure 16:
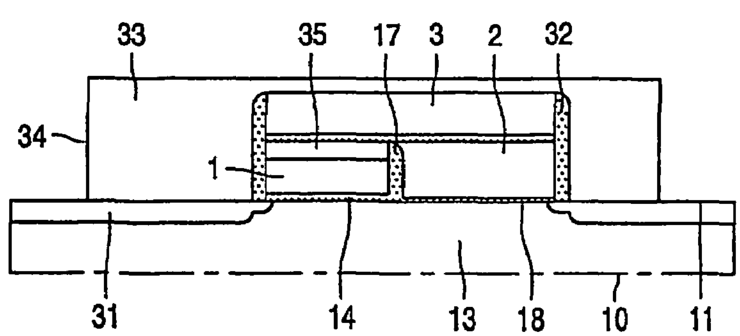
Figure 17:
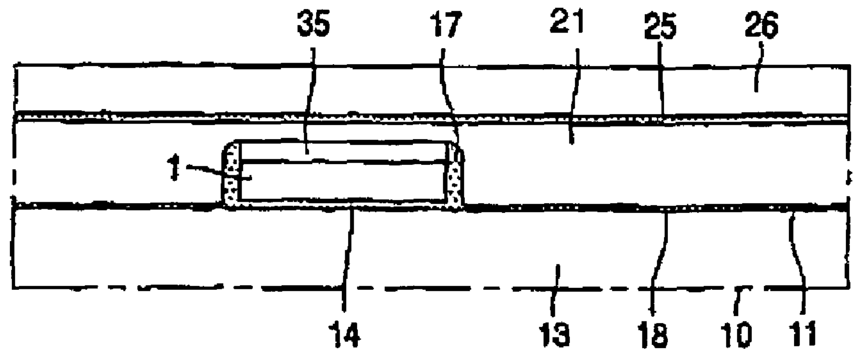
Figure 18:
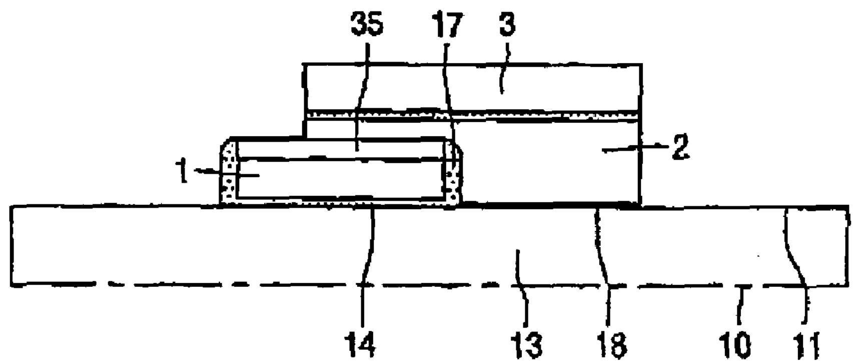
Figure 19:
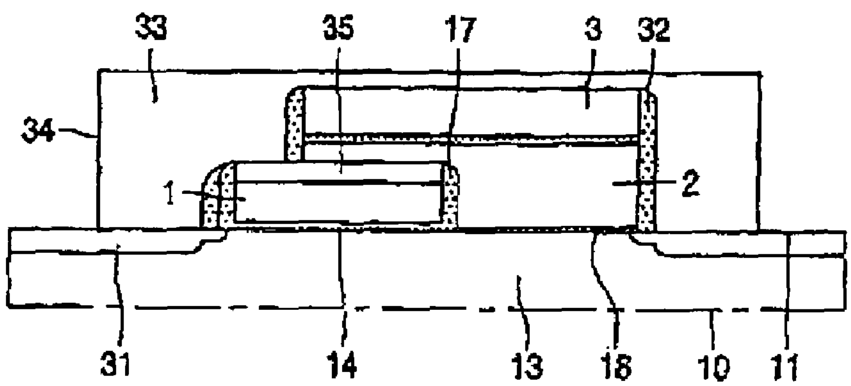
Figure 20:
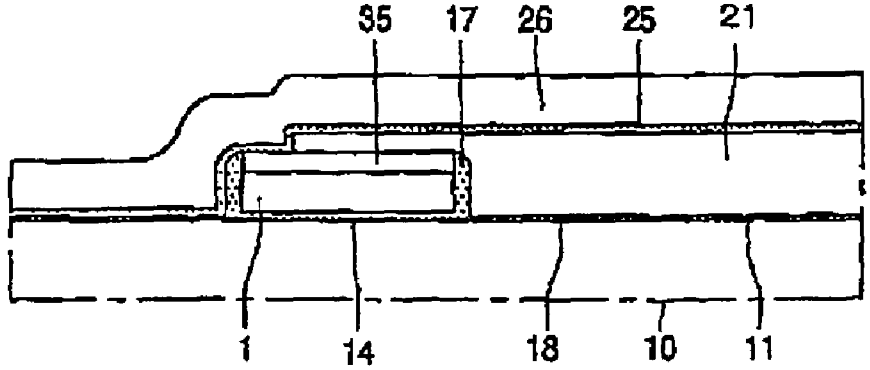
Figure 21:
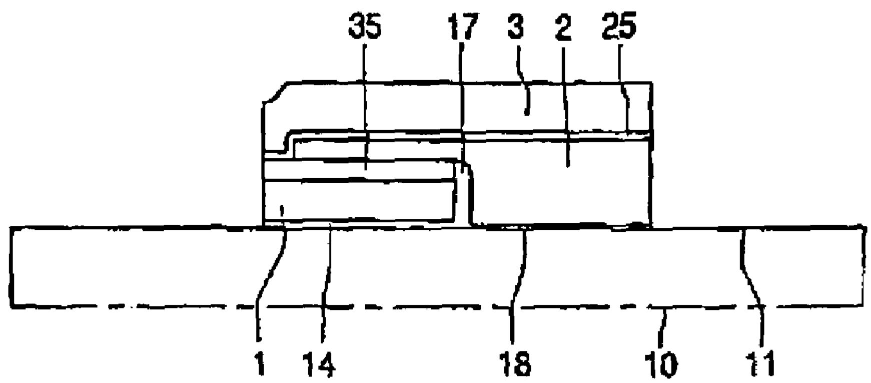
Figure 22:
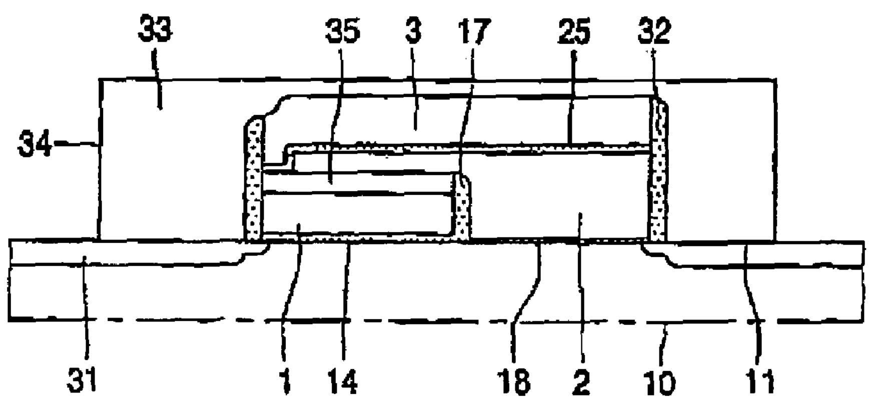

In the drawings:

FIG. 1 is an electrical circuit diagram of a memory formed by means of the method in accordance with the invention, FIGS. 2 through 14 are diagrammatic, cross-sectional plan views of several stages in the manufacture of a first example of a semiconductor device comprising a non-volatile memory, manufactured by means of the method in accordance with the invention, FIG. 15 and FIG. 16 are diagrammatic, cross-sectional views of stages in the manufacture of a second example of a semiconductor device comprising a non-volatile memory, manufactured by means of the method in accordance with the invention, FIG. 17 through FIG. 19 are diagrammatic, cross-sectional views of a few stages in the manufacture of a third example of a semiconductor device comprising a non-volatile memory, manufactured by means of the method in accordance with the invention, and FIG. 20 through FIG. 22 are diagrammatic, cross-sectional views of a few stages in the manufacture of a fourth example of a semiconductor device comprising a non-volatile memory, manufactured by means of the method in accordance with the invention.

FIG. 1 shows an electrical circuit diagram of a non-volatile memory comprising a matrix of memory cells Mij arranged in rows and columns, where i represents the number in the row and j represents the number in the column. Each memory cell comprises a select transistor T1 with a select gate 1, and a memory transistor T2 which is arranged in series with said select transistor T1 and includes a floating gate 2 and a control gate 3. The select gates 1 of the select transistors T1 are interconnected per column by select lines SLj, the control gates of the memory cells are interconnected per column by word lines WLj. In addition, the memory transistors are connected, per row, with bit lines BLi and the select transistors are connected with a common source line SO.

FIGS. 2 through 14 diagrammatically show several stages in the manufacture of a first example of a semiconductor device comprising a non-volatile memory with memory cells including a select transistor T1 with a select gate 1 and including a memory transistor T2 with a floating gate 2 and a control gate 3. In this method, active semiconductor regions 13 which are mutually insulated by field oxide 12 are formed in a semiconductor body 10 so as to border on a surface 11 of said semiconductor body, which, in this case, is a silicon body of which only the top layer is shown which is lightly p-doped with approximately $10^{15}$ atoms per cc. On the surface 11, an approximately 10 nm thick gate oxide layer 14 is formed by thermal oxidation on which, subsequently, an approximately 150 nm thick first layer of a conductive material, in this case n-type doped polycrystalline silicon, is deposited. In this first layer of conductive material, conductive strips 15, which serve as select lines SL, are formed transversely to the active regions 13, which conductive strips are provided with a layer of an insulating material 17 on the walls 16 extending transversely to the surface. At the location of the active regions 13, these strips 15 form the select gates 1 of the select transistors T1, the side walls of said select gates 1 being provided with an insulating material. The select lines SL and the select gate 1 are formed in the same process steps.

Figure 2:
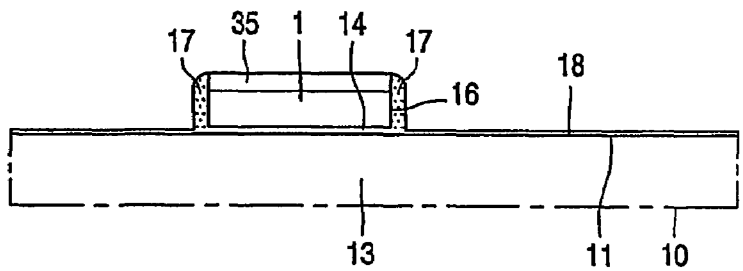
Figure 3:
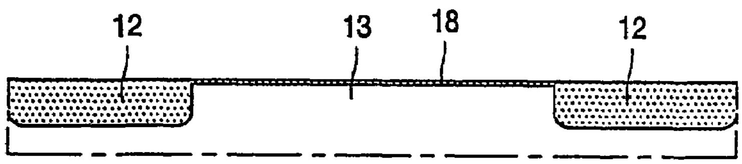
Figure 4:
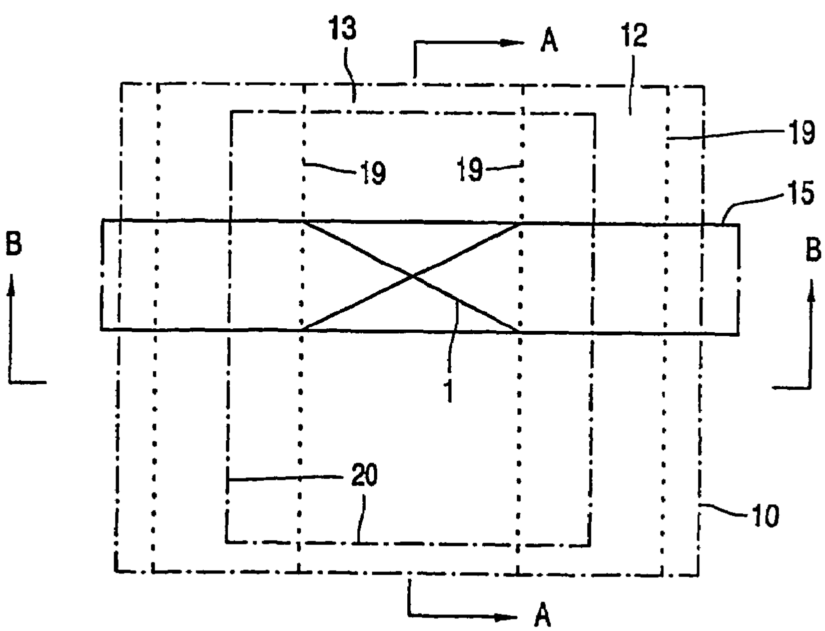

The conductive strip 15 serving as select line SL and hence the select gate 1 is provided with an insulating material 17 on the side walls 16 extending transversely to the surface 11. Said insulating material may be provided by thermal oxidation of the select line 15, or alternatively, as in this case, by providing insulating spacers on the side walls in a customary manner. Subsequently, the gate oxide next to the select gate 1 is removed and substituted with an approximately 7 nm thick tunnel oxide layer 18 formed by thermal oxidation of the surface 11. The structure thus formed is shown in FIGS. 2, 3 and 4. FIG. 4 shows this structure in a plan view, wherein the dotted lines 19 are the boundary lines of the field oxide regions 12 and the active regions 13, and wherein the center lines 20 are the boundary lines of one of the memory cells to be formed. FIG. 2 is a cross-sectional view taken on the line A—A in FIG. 4, and FIG. 3 is a cross-sectional view taken on the line B—B.

Figure 5:
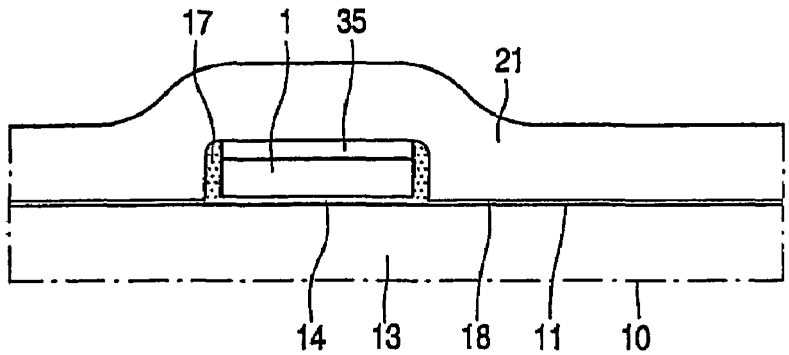
Figure 6:
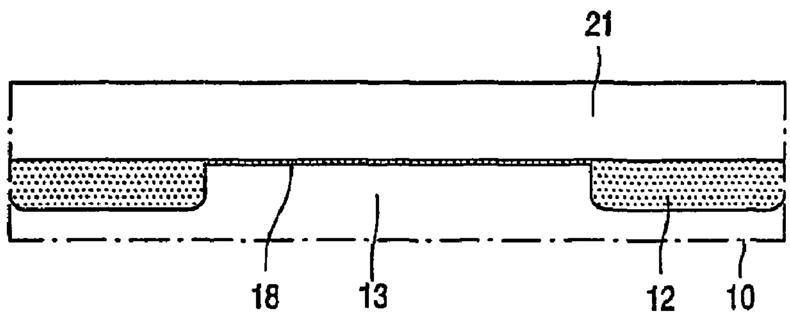
Figure 7:
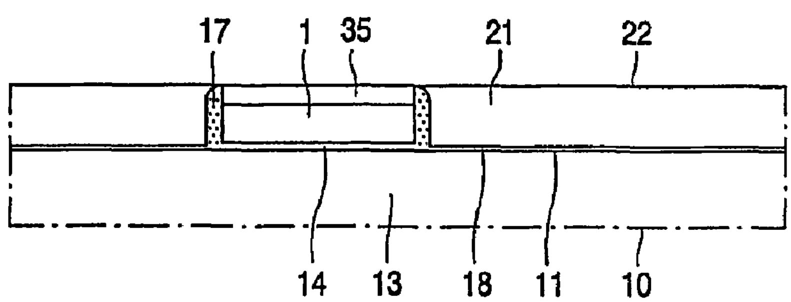
Figure 8:
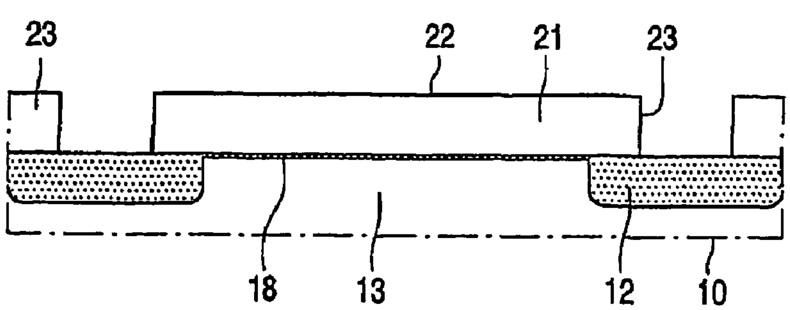

As shown in FIG. 5 (cross-sectional view taken on the line A—A) and FIG. 6 (cross-sectional view taken on the line B—B) a second layer of a conductive material 21, in this case an approximately 400 nm thick, n-type doped layer of polycrystalline silicon is deposited on the structure shown in FIGS. 2 through 4. The second layer of conductive material 21 is deposited in a thickness that exceeds that of the select gate 1, after which this layer of conductive material, as shown in FIGS. 7 and 8, is planarized in a customary manner by means of a chemical-mechanical polishing treatment, a flat surface 22 being formed on the second conductive layer 21.

Figure 9:
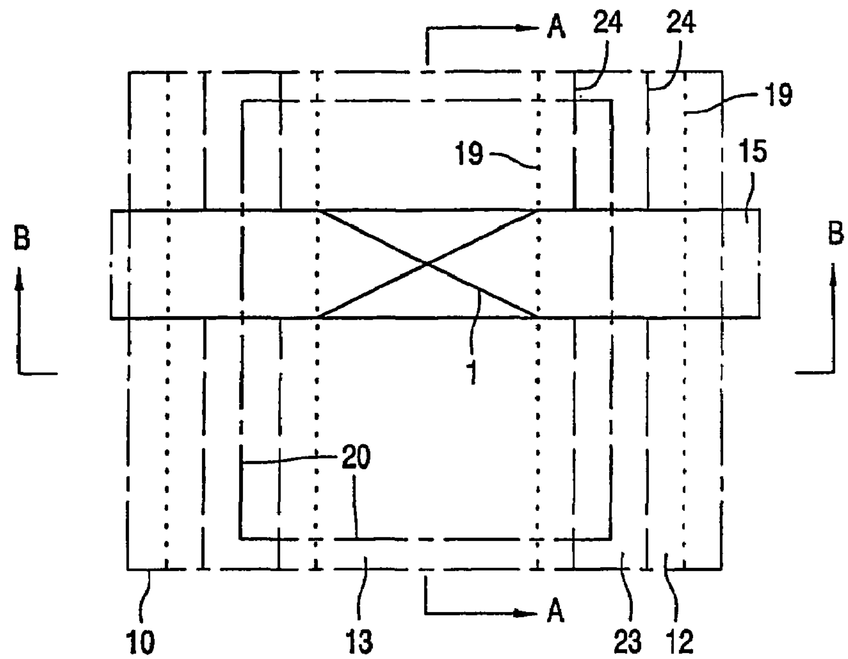

In the planarized second conductive layer 21, approximately 200 nm wide grooves 23 are subsequently etched so as to extend transversely to the select gates 1, in which grooves the insulating layers 17 formed on the select gates and the surface 11 that is present on field isolation regions 12 and extends between the select gates are exposed. This structure is shown in FIGS. 8 and 9. The dashed lines 24 are the boundary lines of the grooves 23.

Subsequently, as shown, a layer of an intermediate dielectric 25 (in this case a packet of an approximately 6 nm thick layer of silicon oxide, an approximately 6 nm thick layer of silicon nitride and an approximately 6 nm thick layer of silicon oxide) and an approximately 200 nm thick third layer of a conductive material 26, in this case polycrystalline silicon, are deposited. During the deposition of the layer of an intermediate dielectric 25 and the third layer of a conductive material 26, the grooves 23 are filled. The comparatively thin layer of said intermediate dielectric 25 is deposited so as to follow the contours of the grooves 23, and the comparatively thick conductive layer 16 entirely fills the grooves 23 and, after the deposition process, exhibits a substantially flat surface at the location of the grooves.

In the third layer of conductive material 26, subsequently, conductive strips 27, serving as word lines WL, are etched in a direction parallel to the select lines 15 so as to at least partly overlap these select lines, which conductive strips form the control gates 3 of the memory transistors T2 at the location of the floating gates 2. During etching the floating gates 2, the control gates 3, in this case the conductor tracks 27 serving as word lines WL, are used for masking purposes. The length of the floating gates 2 in the direction of the select gates 1 and the control gates 3, is now determined by the distance between the grooves 23 etched in the second layer of conductive material. In the third layer of conductive material 26, the control gate 3 is formed as described above and extends above and next to the select gate 1, after which the floating gate 2 is etched in the second layer of conductive material 21, using the word line 27, of which the control gate 3 forms part, as a mask.

Figure 10:
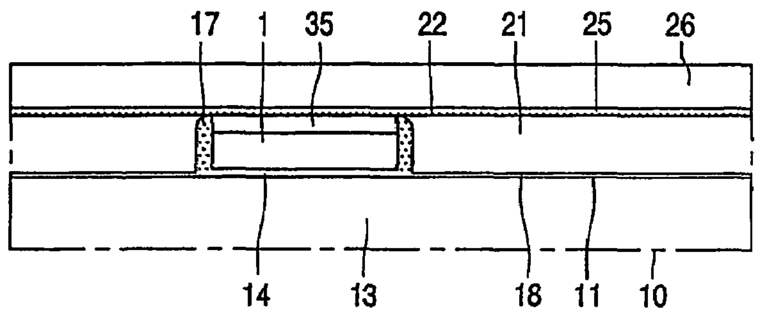
Figure 11:
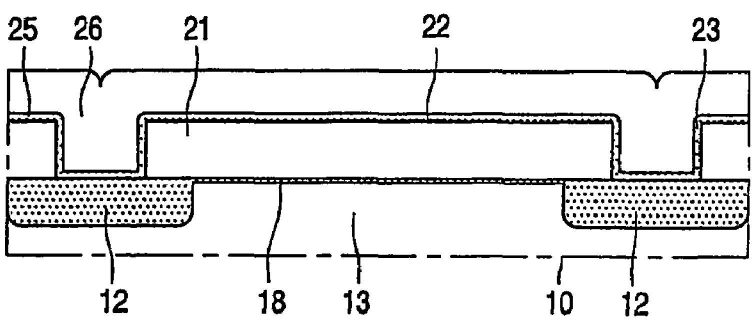
Figure 12:
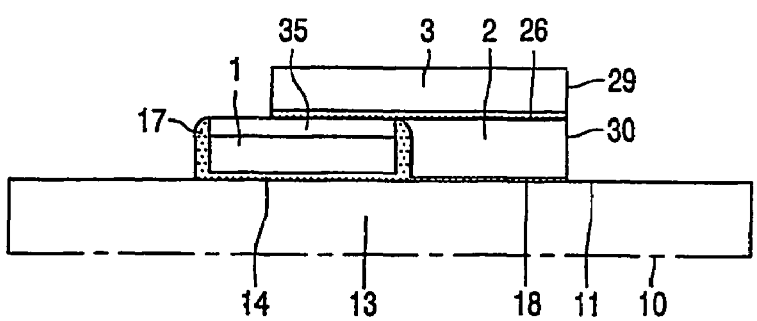

As shown in FIGS. 10, 11 and 12, the layer of intermediate dielectric 25 and the third layer of conductive material 26 are deposited on a flat surface 22 and hence also demonstrate a flat surface 28 and, in addition, a homogeneous thickness. The control gate 3 and the floating gate 2 can be etched without problems in these flat layers. In addition, these gates 3, 2 can be formed so as to comprise a wall 29, 30 which extends transversely to the surface of the semiconductor body and at a comparatively small distance from the select gate 1.

Figure 13:
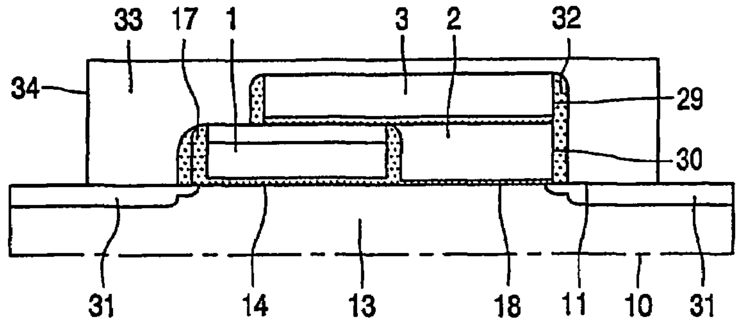

Finally, source and drain regions 31 are formed in a customary manner in the active regions 13, the side walls 29, 30 of the etched control gate 3 and floating gate 2 are provided with insulating spacers 32, a layer of an insulating material 33 is provided wherein windows 34 are etched, through which the source and drain regions 31 can be contacted. The structure thus formed is shown in FIGS. 13 and 14.

Prior to the formation of the conductor tracks 15, forming the select lines SL, in the first layer of conductive material, a layer of an insulating material is deposited on this layer and the select lines SL are formed in the first layer of conductive material and in the layer of insulating material deposited thereon. The select lines SL and hence the select gates 1 are thus readily provided, on the top side, with an insulating layer 35, as shown in FIG. 2. Preferably, this insulating layer 35 can be used as a stop layer during the planarization of the second layer of conductive material 21. In this example, use is made of a 100 nm thick layer of silicon nitride.

In the first example shown in FIGS. 2 through 14, and in the second example shown in FIG. 15, the planarization process is terminated as soon as the insulating layer 35 has been reached. Planarization of the second layer of conductive material 21 can thus be terminated in a satisfactorily controlled manner.

FIGS. 15 and 16 show stages in the manufacture of a second example of a non-volatile memory with a very compact memory cell. These Figures are based on the situation shown in FIG. 10. In this case, the control gate 3 is formed so as to only partly overlap the select gate 1, as shown in FIG. 12. During etching the second layer of conductive material 20, in which process the control gate 3 is used as a mask, also the uncovered part of the select gate 1 is etched away. As a result, the width of the cell is determined by the width of the control gate 3.

After the formation of the floating gate 2, and in this case the select gate 1, source and drain regions 31 are formed in a customary manner, as shown in FIG. 16, in the active regions 13, the side walls 29, 30 of the etched control gate 3 and floating gate 2 are provided with insulating spacers 32, a layer of an insulating material 33 is provided wherein windows 34 are etched through which the source and drain regions 31 can be contacted.

In the manufacture of the third and fourth examples of a non-volatile memory, the planarization of the second layer of conductive material 21, as shown in FIG. 17, is stopped before this layer of conductive material has been entirely removed above the select gate 1. The second layer of conductive material 21 extends, after the planarization process, over the select gate 1. As a result, the control gate 3 will be situated, throughout the width thereof, on the floating gate 2. This results in substantial capacitive coupling between control gate 3 and floating gate 2. By virtue thereof, data can be stored in the memory at a comparatively low voltage on the control gate, and stored data can be read at a comparatively low voltage on the control gate.

FIGS. 17 through 19 show several stages in the manufacture of a third example of a semiconductor device with a non-volatile memory. FIG. 18 shows that the floating gate 2 is etched, using the control gate 3 as a mask. In this case, the control gate entirely overlaps the floating gate. In FIG. 19, source and drain regions 31 are formed in the active regions 13, the side walls 29, 30 of the etched control gate 3 and floating gate 2 are provided with insulating spacers 32, a layer of insulating material 33 is provided wherein windows 34 are etched through which the source and drain regions 31 can be contacted.

FIGS. 20 through 22 show several stages in the manufacture of a fourth example of a semiconductor device with a non-volatile memory. In this case, the second conductive material 21, as shown in FIG. 20, is locally removed before the layer of intermediate dielectric 25 is deposited, as a result of which this second conductive material 21, only partly overlaps the select gate 1. The control gate 3 is formed such that it does not entirely cover the select gate 1, whereas it does entirely cover the second layer of conductive material 20. During etching the second conductive material 21, in which process the control gate 3 is used as a mask, also the part of the select gate 1 that is not covered by the control gate 3 is etched away. As the second conductive material 21, is locally removed from the select gate 1, only a layer of intermediate dielectric 25 is situated on the edge of the control gate 3 between the third layer of conductive material 26 and the select gate 1. By virtue thereof, etching the select gate 1 becomes possible. If the floating gate 2 were to be present on the edge of the control gate 3, then the edge of the floating gate 2 situated below the intermediate dielectric 25 would be seriously affected during etching the select gate 1.

FIG. 22 shows also in this case that the etched control gate 3 and floating gate 2 are provided with insulating spacers 32, a layer of insulating material 33 is provided wherein windows 34 are etched through which the source and drain regions 31 can be contacted.

What is claimed is:

1. A method of manufacturing a semiconductor device comprising a non-volatile memory with memory cells including a select transistor with a select gate and including a memory transistor with a floating gate and a control gate, the method comprising:

- forming active semiconductor regions in a semiconductor body, the active semiconductor regions bordering on a surface of the semiconductor body, and the active semiconductor regions being mutually insulated by field oxide;
- providing a layer of gate oxide on the surface of the semiconductor body and a first layer of conductive material on the layer of gate oxide and the semiconductor body, wherein:
  - the first layer of conductive material being etched to form the select gate on the layer of gate oxide,
  - the select gate being provided with side walls of insulating material wherein the side walls of insulating material extending transversely to the surface of the semiconductor body,
  - the gate oxide next to the select gates being removed and substituted with a layer of tunnel oxide,
  - the first layer of conductive material further forming the first conductive strips serving as selective lines extending transversely to the active semiconductor regions, the first conductive strips deposited over the layer of gate oxide, the first conductive strips spanning a width between the side walls of insulating material, the first conductive strips forming select gates of the select transistors;
- thereafter, depositing a second layer of conductive material over the select gates and the semiconductor body characterized in that the second layer of conductive material is deposited in a thickness that exceeds thickness of the select gates;
- thereafter, planarizing the second layer of conductive material;
- after planarizing the second layer of conductive material, etching grooves in the second layer of conductive material, the grooves extending transversely to the select lines and exposing the field oxide and the select lines having the side walls of insulating material;
- thereafter, depositing a layer of an intermediate dielectric over the second layer of conductive material and in the grooves;
- depositing a third layer of conductive material over the layer of intermediate dielectric and in the grooves wherein the grooves being filled with the layer of interlayer dielectric and the third layer of conductive material;
- forming the control gate in the third layer of conductive material, wherein the control gate extending above and next to the select gate, the third layer of conductive material further forming second conductive strips serving as word lines in the third layer of conductive material wherein the word lines parallel to the select lines and at least partly overlapping the select lines, the second conductive strips forming the control gates of the memory transistors at location of the floating gates;
- etching the floating gate in the second layer of conductive material by using the control gate as a mask.

2. The method as recited in claim 1, wherein before forming the select lines in the first layer of conductive material, a layer of an insulating material is deposited on the first layer of conductive material, and the select lines are formed in the first layer of conductive material and in the layer of insulating material deposited thereon.

3. A method as recited in claim 2, wherein the layer of insulating material deposited on the first layer of conductive material is used as a stop layer during the planarization of the second layer of conductive material.

4. The method as recited in claim 3, wherein the stop layer includes silicon nitride.

5. A method as recited in claim 2, wherein the planarization of the second layer of conductive material is continued until the layer of insulating material present on the select gate has been exposed.

6. The method as recited in claim 5, wherein the control gate is used as a mask and partially overlaps the select gate, and during an etch of the second layer of conductive material the exposed part of the select gate is etched as well.

7. The method as recited in claim 2, wherein the planarization of the second layer of conductive material is interrupted before the second layer of conductive material has been completely removed above the select gate.

8. The method as recited in claim 7, wherein the method further comprises, removing locally the second layer of conductive material before depositing the layer of the intermediate dielectric, so that the second layer of conductive material only partially overlaps the select gate, forming the control gate over the select gate, the control gate serving as a mask, wherein the control gate covers a portion of the select gate, but the control gate completely overlaps the second layer of conductive material, and etching the portion of the select gate not covered by the control gate.

* * * * *